(12) United States Patent
Kohyama

(10) Patent No.: US 8,310,003 B2
(45) Date of Patent: Nov. 13, 2012

(54) SOLID-STATE IMAGING DEVICE WITH VERTICAL GATE ELECTRODE AND METHOD OF MANUFACTURING THE SAME

(75) Inventor: Yusuke Kohyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 12/509,810

(22) Filed: Jul. 27, 2009

(65) Prior Publication Data

US 2010/0025738 A1    Feb. 4, 2010

(30) Foreign Application Priority Data

Jul. 31, 2008  (JP) .................................. 2008-198274

(51) Int. Cl.
*H01L 29/66* (2006.01)
(52) U.S. Cl. ........ 257/330; 257/215; 257/222; 257/234; 257/242; 257/244; 257/258; 257/E31.001
(58) Field of Classification Search .................. 257/215, 257/222, 234, 242, 244, 258, 330, E31.001
See application file for complete search history.

(56) References Cited

U.S. PATENT DOCUMENTS

| 5,021,355 A | * | 6/1991 | Dhong et al. | 438/270 |
| 2007/0184614 A1 | * | 8/2007 | Adkisson et al. | 438/259 |

FOREIGN PATENT DOCUMENTS

| CN | 1929146 A | 3/2007 |
| JP | 08-255888 | 10/1966 |
| JP | 2005-223084 | 8/2005 |
| JP | 2005-294701 | 10/2005 |
| JP | 2007-96271 | 4/2007 |
| JP | 2007-294531 | 11/2007 |

OTHER PUBLICATIONS

Chinese Office Action issued Oct. 29, 2010, in Patent Application No. 200910165539.1 (with English-language translation).
Office Action in Japanese Patent Application No. 2008-198274, mailed Jun. 25, 2012 (with English Translation).

* cited by examiner

*Primary Examiner* — Tan N Tran
(74) *Attorney, Agent, or Firm* — Oblon, Spivak, McClelland, Maier & Neustadt, L.L.P.

(57) ABSTRACT

A charge accumulation region of a first conductivity type is buried in a semiconductor substrate. A charge transfer destination diffusion layer of the first conductivity type is formed on a surface of the semiconductor substrate. A transfer gate electrode is formed on the charge accumulation region, and charge is transferred from the charge accumulation region to the charge transfer destination diffusion layer.

8 Claims, 8 Drawing Sheets

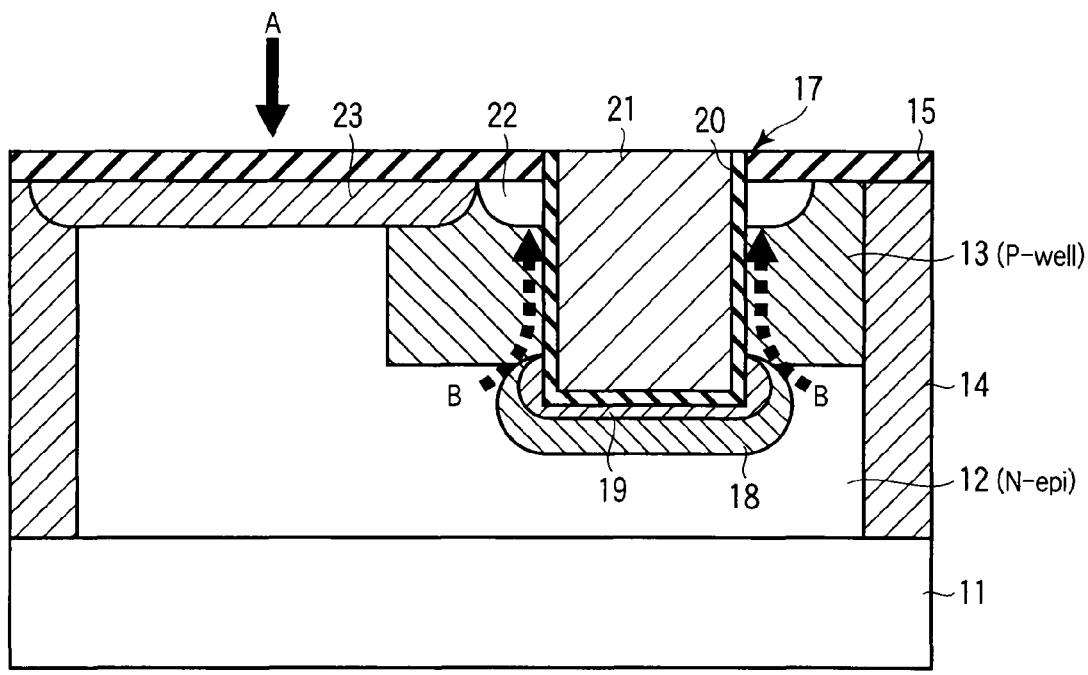
F I G. 1
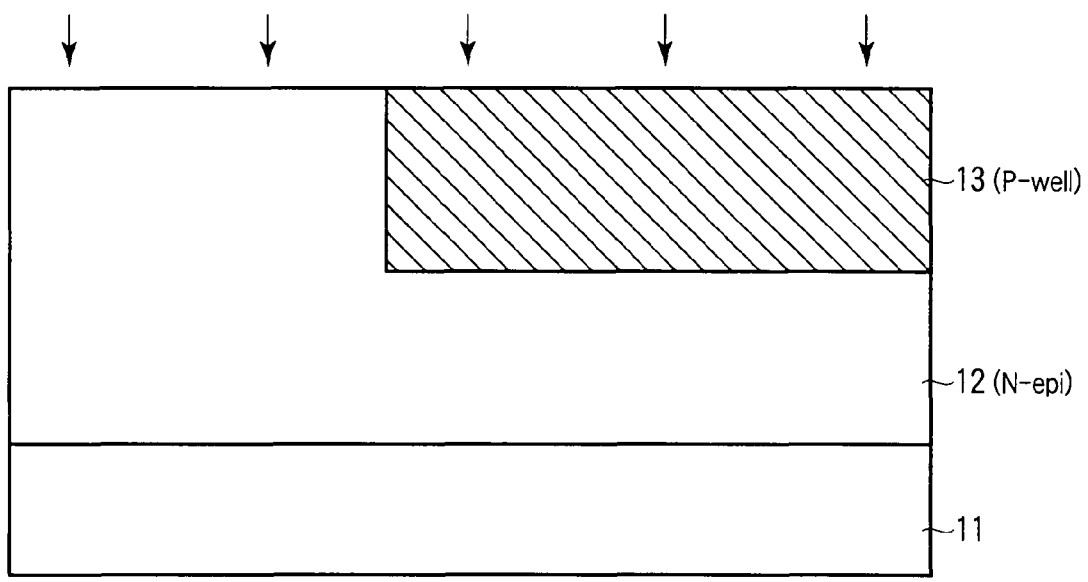
F I G. 2

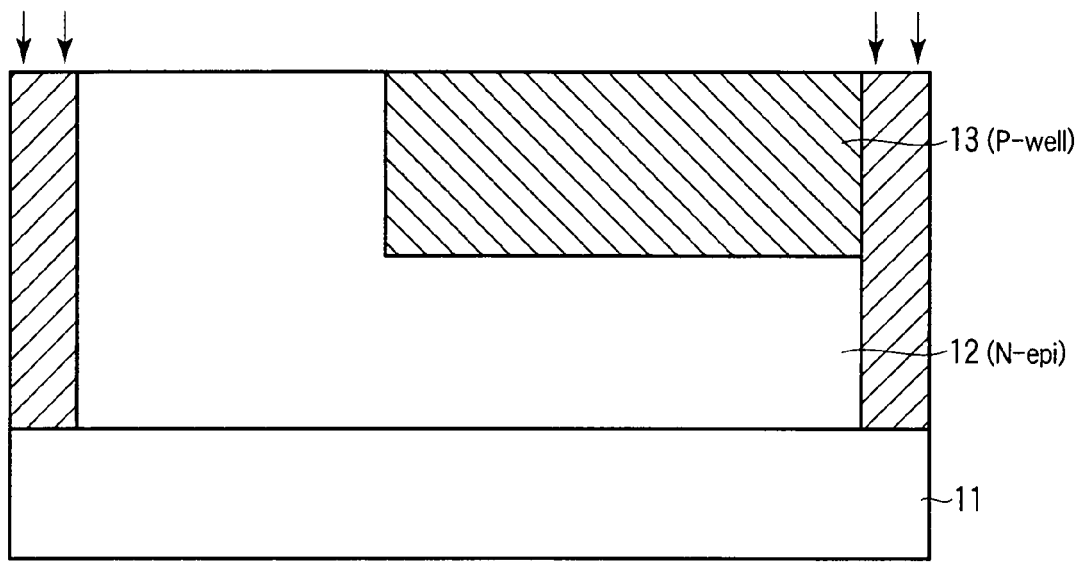
F I G. 3
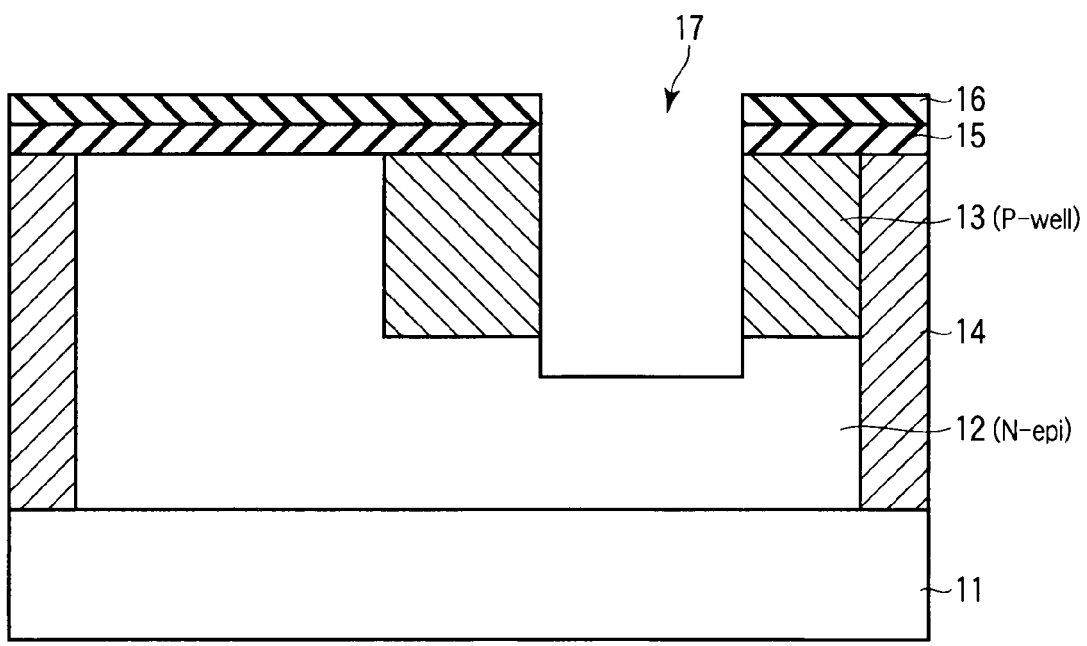
F I G. 4

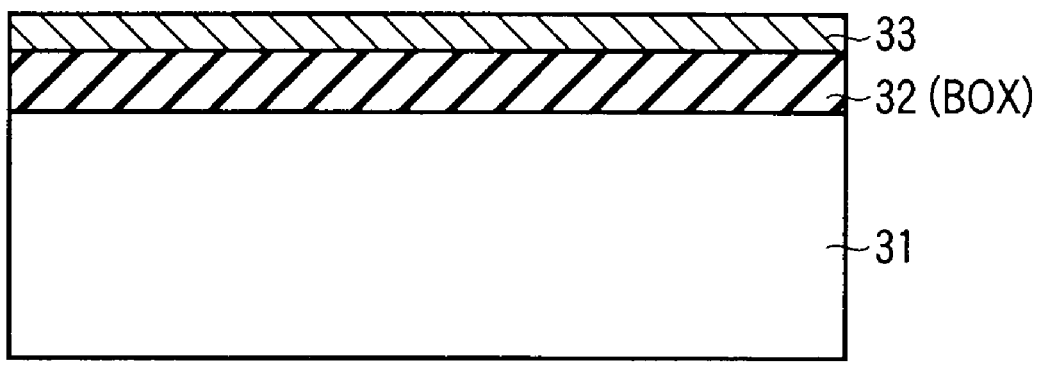
F I G. 7
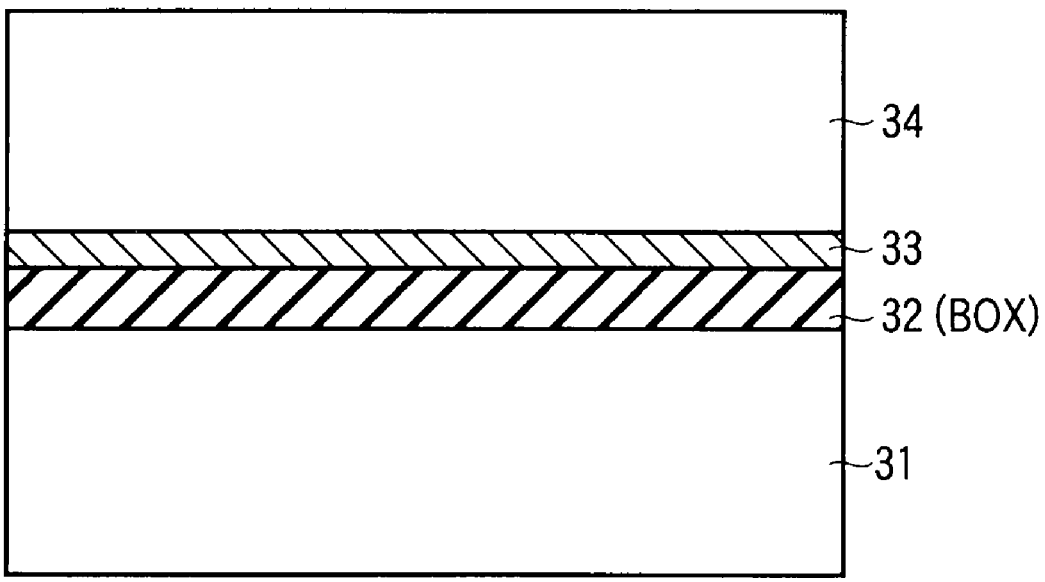
F I G. 8

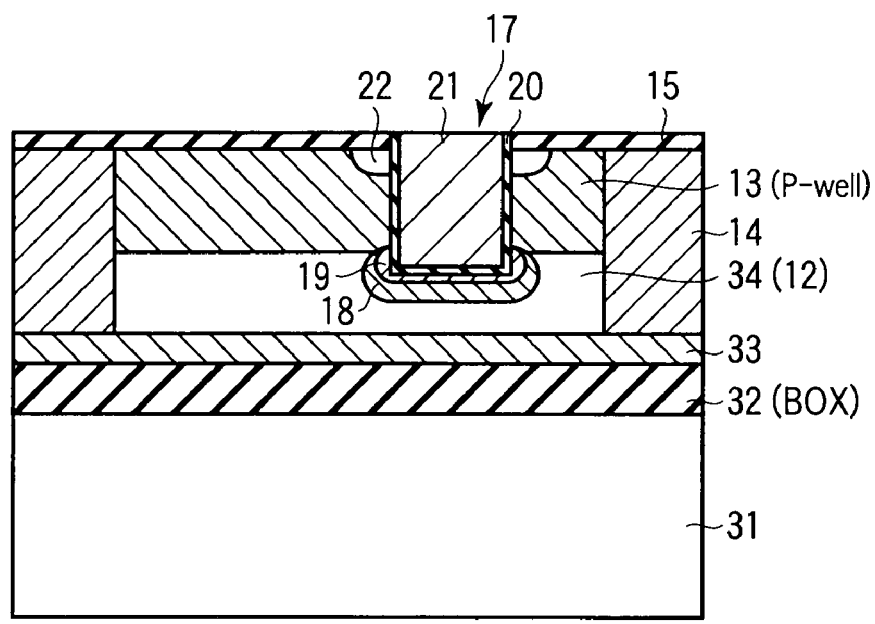
F I G. 9
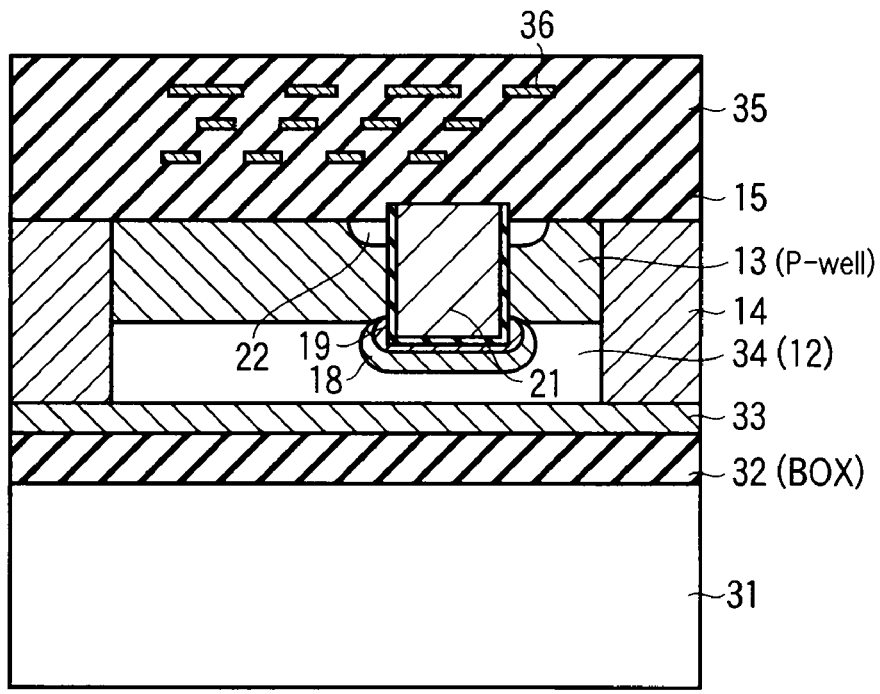
F I G. 10

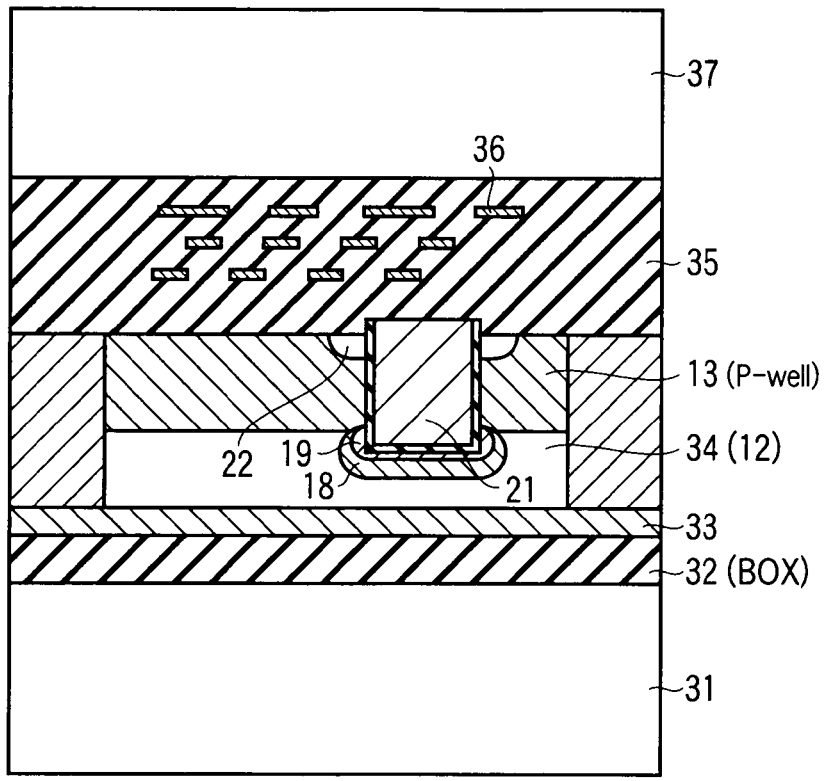
F I G. 11
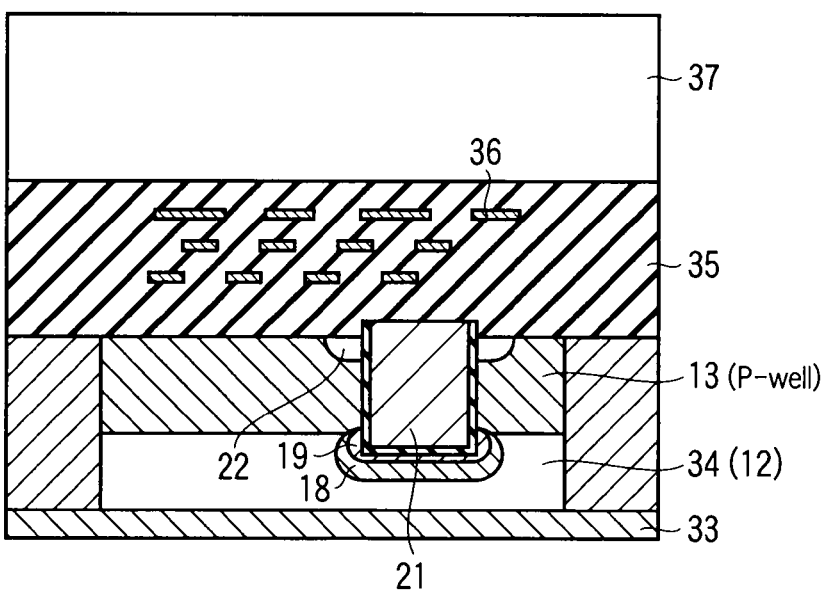
F I G. 12

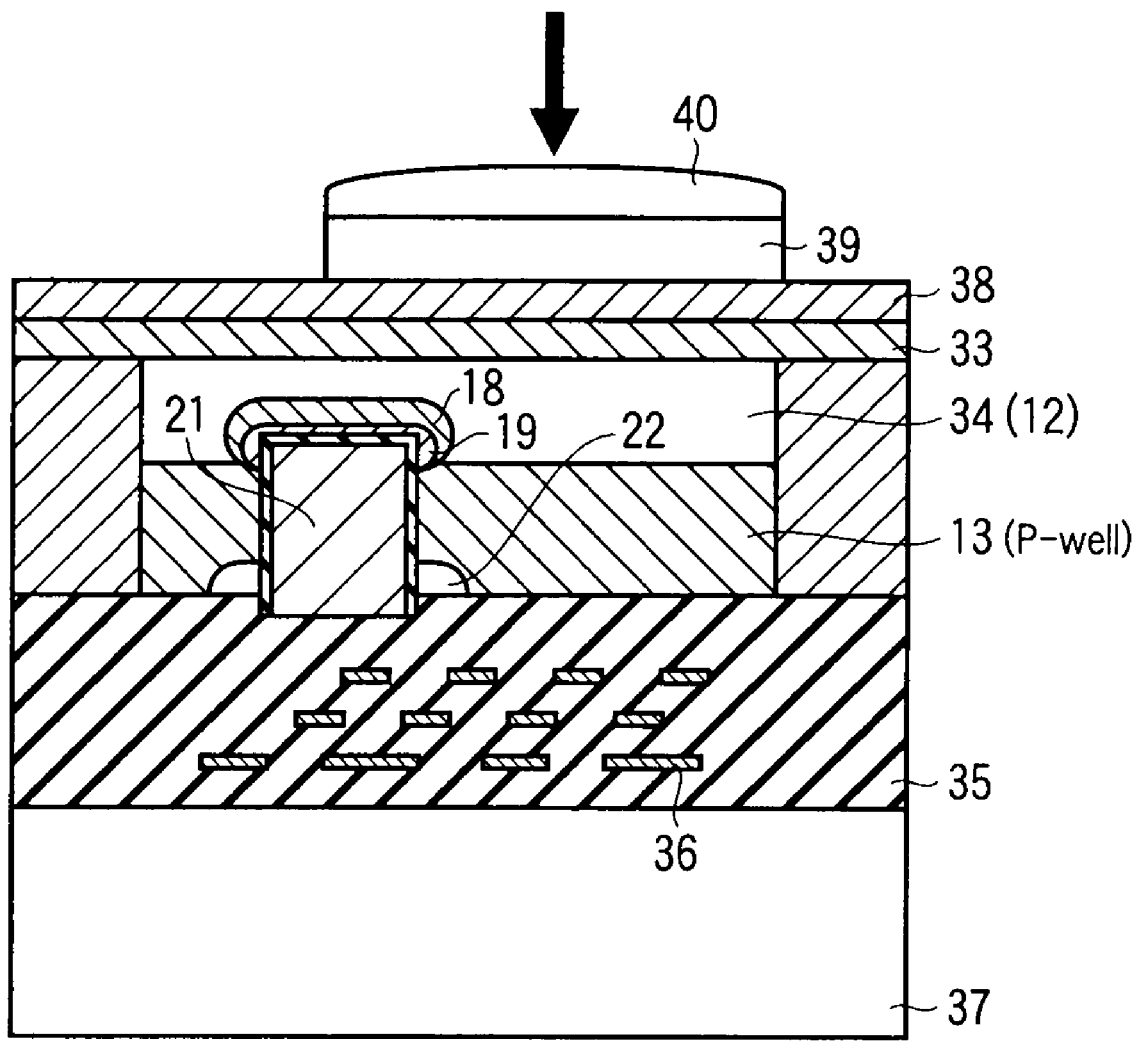
F I G. 13

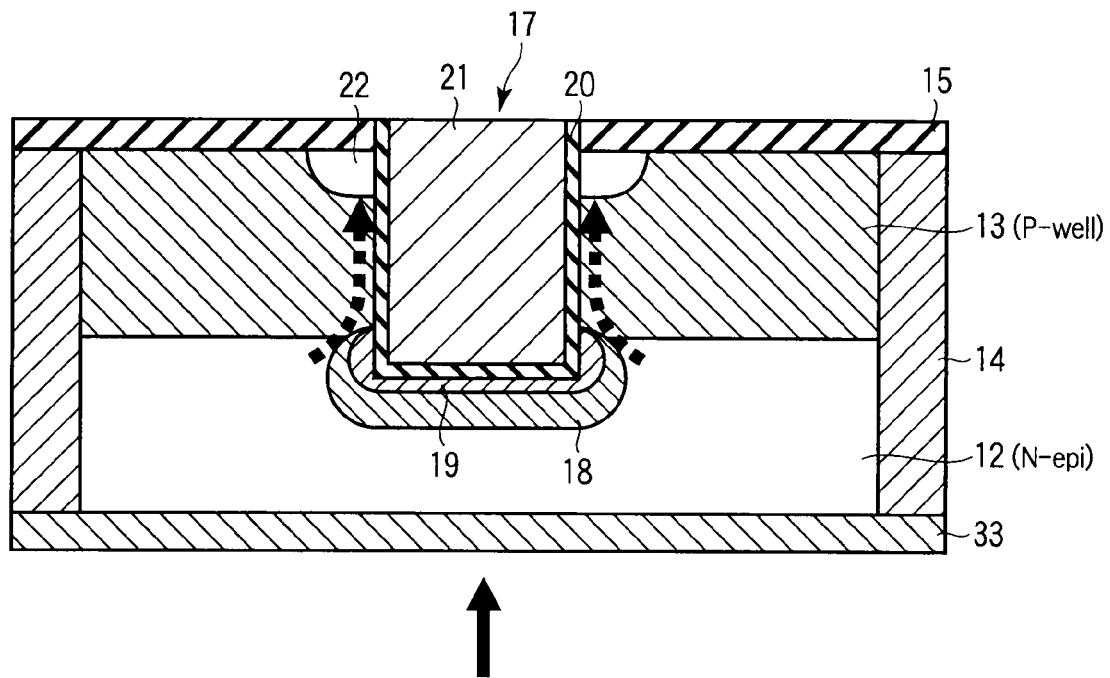
F I G. 14
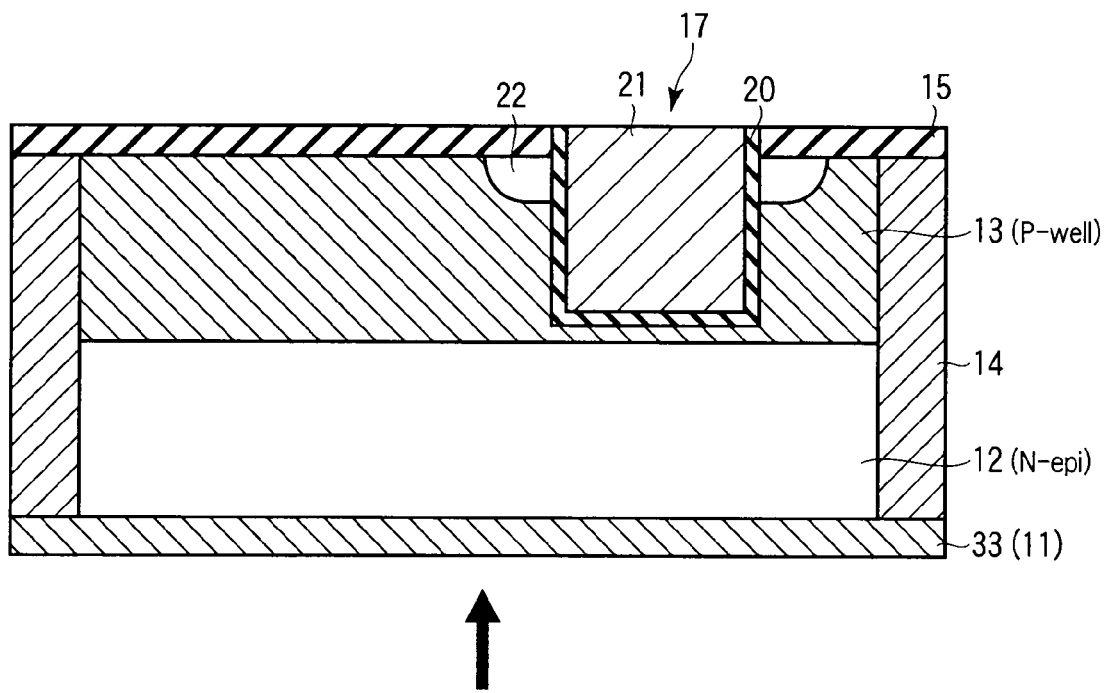
F I G. 15

SOLID-STATE IMAGING DEVICE WITH VERTICAL GATE ELECTRODE AND METHOD OF MANUFACTURING THE SAME

CROSS-REFERENCE TO RELATED APPLICATIONS

This application is based upon and claims the benefit of priority from prior Japanese Patent Application No. 2008-198274, filed Jul. 31, 2008, the entire contents of which are incorporated herein by reference.

BACKGROUND OF THE INVENTION

1. Field of the Invention

The present invention relates generally to a solid-state imaging device and a method of manufacturing the same, and more particularly to a solid-state imaging device with a vertical transfer electrode and a method of manufacturing the same.

2. Description of the Related Art

In recent years, attention has been paid to the market of small-sized camera modules which are applicable to digital still cameras and camera-equipped mobile phones. With the reduction in size of camera modules, imaging devices, such as CCDs and CMOS sensors, have been reduced in size year after year. However, since the improvement in sensor performance and the microfabrication are not compatible, it is expected that further microfabrication becomes difficult more and more. A typical example of incompatibility between performance and microfabrication is a decrease in plan-view area of a photodiode. Specifically, although finer microfabrication is made possible by the decrease in plan-view area of the photodiode, the amount of charge that is accumulated in the photodiode decreases. The amount of charge that is accumulated in the photodiode is an important factor which determines the sensor performance, and the decrease in the amount of charge that is accumulated in the photodiode deteriorates the sensor performance. The key to increase the area of the photodiode is finer microfabrication of a component other than the photodiode within one pixel, for instance, finer microfabrication of a transfer gate electrode.

Conventionally, in a solid-state imaging element having a horizontal transfer gate electrode, the transfer gate electrode is formed on the semiconductor substrate via a gate insulation film. A charge accumulation region, a shield layer and a charge transfer destination diffusion layer which receives transferred charge are formed in the semiconductor substrate. The light that has been made incident via a light incidence path is photoelectrically converted in the charge accumulation region to an electric signal. By turning on the transfer gate electrode, the charge that is accumulated in the charge accumulation region is read out to the charge transfer destination diffusion layer via a charge transfer channel. Since the charge transfer channel is horizontal to the substrate surface, this charge transfer is called "horizontal transfer". The transfer distance of charge is determined by the gate length of the transfer gate electrode. Thus, in order to secure a sufficient modulation degree, a sufficient gate length is necessary, and there is a problem that device microfabrication is difficult. In addition, because of the horizontal transfer, the charge transfer destination diffusion layer needs to be formed on a side opposite to the side of the charge accumulation region of the transfer gate electrode, and there a problem that it is difficult to reduce the plan-view pixel area. Therefore, there has been a demand for a solid-state imaging device and a manufacturing method thereof, which can reduce the pixel area and can secure a sufficient modulation degree.

As related art, there has been developed a solid-state imaging device in which a gate electrode is formed so as to penetrate the substrate, thereby to enhance the efficiency of light incidence in a photoelectric conversion part (see, e.g. Jpn. Pat. Appln. KOKAI Publication No. 2007-96271).

BRIEF SUMMARY OF THE INVENTION

According to a first aspect of the invention, there is provided a solid-state imaging device comprising: a semiconductor substrate; a charge accumulation region of a first conductivity type which is buried in the semiconductor substrate; a diffusion layer of the first conductivity type which is formed on a surface of the semiconductor substrate; and a transfer gate electrode which is formed on the charge accumulation region.

According to a second aspect of the invention, there is provided a method of manufacturing a solid-state imaging device, comprising: forming a well region of a second conductivity type in a semiconductor layer of a first conductivity type which is formed on a surface of a semiconductor substrate; forming a trench in the well region of the second conductivity type in the semiconductor layer of the first conductivity type; forming a gate insulation film on an inner wall of the trench; burying a gate electrode material in the trench; and forming a diffusion layer of the first conductivity type on a surface of the well region of the second conductivity type.

BRIEF DESCRIPTION OF THE SEVERAL VIEWS OF THE DRAWING

FIG. 1 is a cross-sectional view showing a solid-state imaging device according to a first embodiment of the invention;

FIG. 2 to FIG. 6 are cross-sectional views illustrating a method of manufacturing the solid-state imaging device according to the first embodiment;

FIG. 7 to FIG. 13 are cross-sectional views illustrating a method of manufacturing a solid-state imaging device according to a second embodiment of the invention;

FIG. 14 is a cross-sectional view showing a modification of the solid-state imaging device according to the second embodiment; and FIG. 15 is a cross-sectional view showing a modification of the solid-state imaging devices according to the first and second embodiments.

DETAILED DESCRIPTION OF THE INVENTION

Figure 5:
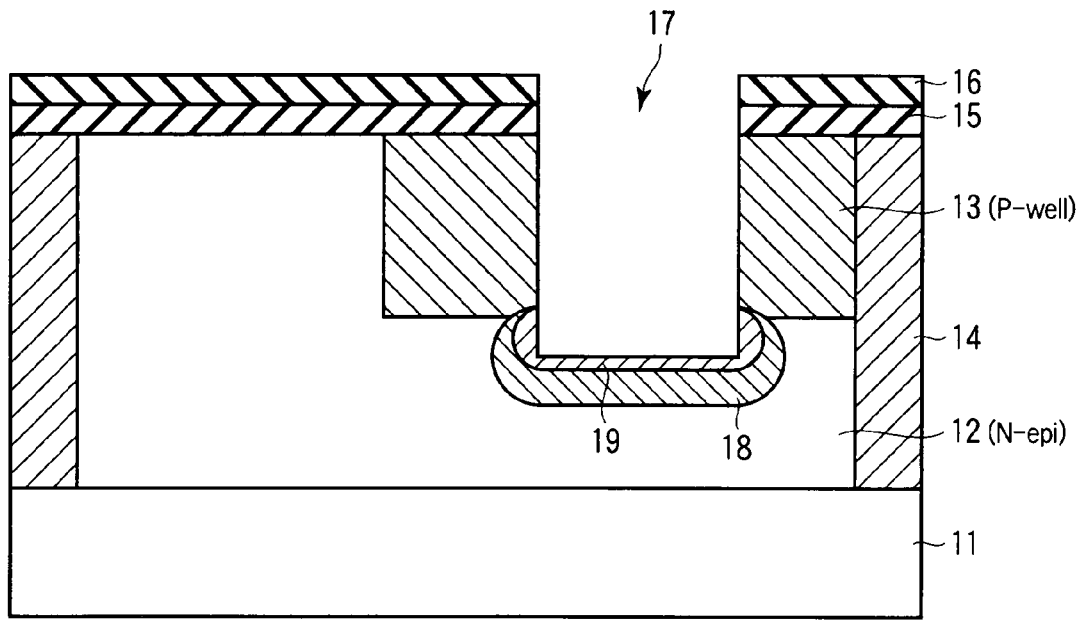

Embodiments of the present invention will now be described with reference to the accompanying drawings.

FIG. 1 is a cross-sectional view showing a solid-state imaging device with a vertical transfer gate according to a first embodiment of the invention. In the description below, one pixel of the solid-state imaging device is also referred to simply as "imaging element". A charge accumulation region 12, which is composed of an epitaxial layer of, e.g. an N type, is formed on a semiconductor substrate 11 of, e.g. a P type. A well region 13 of, e.g. the P type is formed on the charge accumulation region 12. A diffusion layer 14 of, e.g. the P type, which reaches the semiconductor substrate 11, is formed in the charge accumulation region 12 and P-type well region 13. The P-type diffusion layer 14 constitutes a pixel isolation region which isolates pixels.

Further, a silicon oxide film 15, for instance, is formed on the P-type well region 13 and P-type diffusion layer 14. A trench 17 is formed in the silicon oxide film 15, well region 13 and charge accumulation region 12. A diffusion layer 18 of, e.g. the N type is formed around a bottom portion of the trench 17 in the charge accumulation region 12. A shield layer 19 of, e.g. the P type is formed in the N-type diffusion layer 18 around the trench 17.

A gate insulation film 20 is formed on an inner wall of the trench 17, and a transfer gate electrode 21 is buried in the trench 17 via the gate insulation film 20. A charge transfer destination diffusion layer 22, which is formed of, e.g. an N-type diffusion layer, is formed around the trench 17 in a surface region of the P-type well region 13. Further, a P-type shield layer 23 is formed on the surface of the charge accumulation region 12. An N-channel MOS transistor is formed by the N-type diffusion layer 18 that is formed at the bottom portion of the trench 17, the charge transfer destination diffusion layer 22, the gate insulation film 20 and the transfer gate electrode 21. In addition, the transfer gate electrode 21 is formed at a position with a bias from a central part to a peripheral part of the charge accumulation region 12 that constitutes the imaging element.

In the above-described structure, light, which is made incident along a light incidence path indicated by an arrow A, is photoelectrically converted to an electric signal by the charge accumulation region 12. In this state, if the transfer gate electrode 21 is set at a high level, a charge transfer channel forms between the N-type diffusion layer 18 and charge transfer destination diffusion layer 22 in the P-type well region 13. The charge, which is accumulated in the charge accumulation region 12, is read out to the charge transfer destination diffusion layer 22 through this charge transfer channel, as indicated by an arrow B in FIG. 1. Since the charge transfer channel is formed vertical to the substrate surface, this structure is called "vertical transfer".

Next, referring to FIG. 2 to FIG. 6, a description is given of a manufacturing method (CMOS image sensor fabrication process) of the solid-state imaging device according to the first embodiment.

As shown in FIG. 2, an N-type epitaxial layer 12 is formed on, e.g. a P-type (silicon) semiconductor substrate 11. The N-type impurity concentration of the epitaxial layer 12 is, e.g. $1\times10^{15}$ to $1\times10^{16}$ cm$^{-3}$. P-type impurities are doped in a part of the epitaxial layer 12 by ion implantation, and thus a P-type well region 13 is formed. The dosage of the impurities is, e.g. $1\times10^{12}$ to $1\times10^{14}$ cm$^{-2}$.

Subsequently, as shown in FIG. 3, in order to isolate imaging elements, P-type impurities, for instance, are doped by high-acceleration ion implantation such that the P-type impurities reach the semiconductor substrate 11. Thereby, a diffusion layer 14 is formed. The dosage of the impurities of the diffusion layer 14 is, e.g. $1\times10^{11}$ to $1\times10^{13}$ cm$^{-2}$. The diffusion layer 14 may be formed by burying a P-type diffusion layer, as well as by the ion implantation.

Thereafter, as shown in FIG. 4, a silicon oxide film 15, for example, is formed over the entire surface, and a silicon nitride film 16 is formed on the silicon oxide film 15. Then, using an ordinary lithography technique and reactive ion etching (RIE) technique, a trench 17 is formed which penetrates the silicon nitride film 16, silicon oxide film 15 and P-type well region 13 and reaches the N-type epitaxial layer 12.

Subsequently, as shown in FIG. 5, an N-type diffusion layer 18 is formed around the trench 17 in the charge accumulation region 12, and a P-type shield layer 19 is formed around the trench 17 in the N-type diffusion layer 18. The impurity concentration of the N-type diffusion layer 18 is set to be higher than the impurity concentration of the charge accumulation region 12. Specifically, the impurity concentration of the charge accumulation region 12 is set to be higher in a part thereof near a transfer gate electrode (to be described later) than in the other part thereof.

The N-type diffusion layer 18 is formed, for example, by vertically implanting N-type impurity ions in the trench 17, and then diffusing the implanted ions in the charge accumulation region 12 by heat treatment. The P-type shield layer 19 is formed, for example, by vertically implanting P-type impurity ions in the bottom part of the trench 17, and then diffusing the implanted ions in the charge accumulation region 12 by heat treatment.

In an alternative fabrication process, the N-type diffusion layer 18 may be formed by depositing silicate glass including, e.g. N-type impurities on the bottom of the trench 17, and then performing solid-state diffusion of the implanted N-type impurities from the bottom part and side wall of the trench 17 into the charge accumulation region 12 by heat treatment. In addition, the P-type shield layer 19 may be formed by depositing silicate glass including, e.g. P-type impurities on the bottom of the trench 17, and then performing solid-state diffusion of the implanted P-type impurities from the bottom part and side wall of the trench 17 into the charge accumulation region 12 by heat treatment. The impurity concentration of the N-type diffusion layer 18 is, e.g. $1\times10^{16}$ to $1\times10^{17}$ cm$^{-3}$, and the impurity concentration of the P-type shield layer 19 is, e.g. $1\times10^{18}$ to $1\times10^{19}$ cm$^{-3}$.

Figure 6:
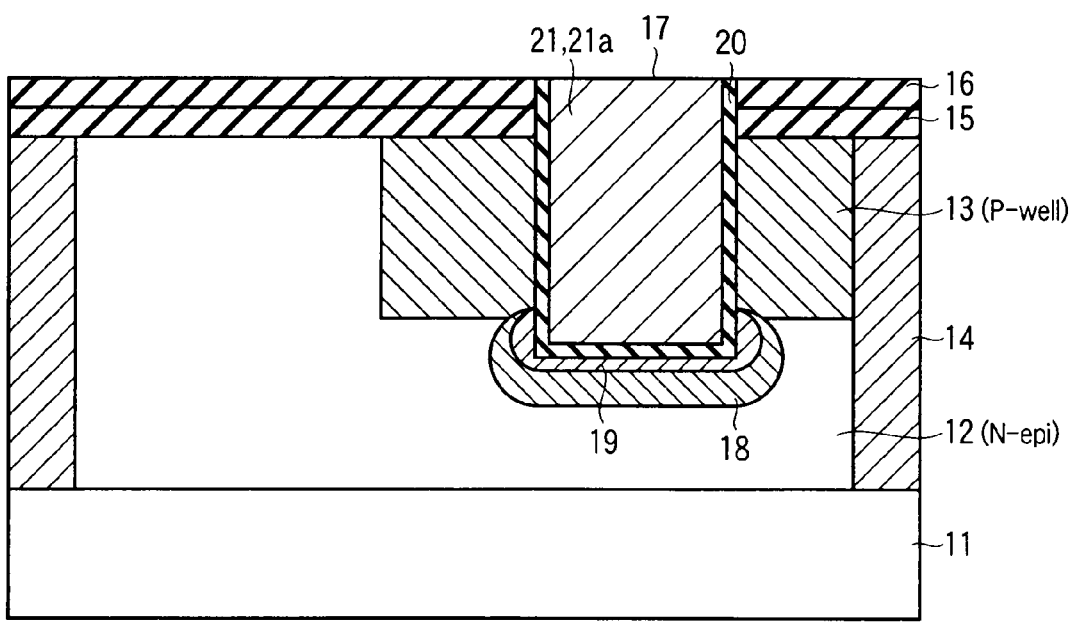

Following the above, as shown in FIG. 6, a gate insulation film 20 is formed on the inner wall of the trench 17, and a polysilicon layer 21a is deposited and buried in the trench 17. Thereafter, using the silicon nitride film 16 as a stopper, the polysilicon layer 21a is planarized by, e.g. chemical mechanical polishing (CMP), and a transfer gate electrode 21 is formed.

After the silicon nitride film 16 is removed, N-type impurities, for example, are doped in the P-well region 13 around the trench 17, and, as shown in FIG. 1, a charge transfer destination diffusion layer 22 is formed. The dosage of the N-type impurities is, e.g. $1\times10^{15}$ to $1\times10^{16}$ cm$^{-2}$. In addition, a P-type shield layer 23 with an impurity concentration of about $1\times10^{18}$ to $1\times10^{19}$ cm$^{-3}$ is formed on the surface of the charge accumulation region 12.

According to the first embodiment, the vertical transfer gate electrode 21 is provided between the charge accumulation region 12 and the charge transfer destination diffusion layer 22. Thus, the charge transfer destination diffusion layer 22 can be provided on the upper side of the charge accumulation region 12. Therefore, the plan-view area of the pixel can be reduced, and the pixel can be made finer.

In addition, since the vertical transfer gate electrode 21 is provided between the charge accumulation region 12 and the charge transfer destination diffusion layer 22, the transfer distance of charge from the charge accumulation region 12 to the charge transfer destination diffusion layer 22 is determined by the trench depth that is the gate length of the vertical transfer gate electrode 21. Accordingly, a sufficient modulation degree can be secured by increasing the depth of the trench. Therefore, the channel length of the transfer gate can properly be adjusted without increasing the plan-view area of the pixel, and both the finer microfabrication of the pixel and the enhancement of the modulation degree can be realized.

Besides, the area of the vertical transfer gate electrode 21, relative to the area of the charge accumulation region 12, can be decreased by reducing the cross-sectional area of the trench in which the vertical transfer gate electrode 21 is formed. Therefore, the photodiode, which is a light reception section, can be made relatively large without increasing the area of the charge accumulation region 12, and the sensor performance can be improved.

Second Embodiment

FIG. 7 to FIG. 13 show a second embodiment of the present invention. In the second embodiment, the parts common to those in the first embodiment are denoted by like reference numerals, and only different parts are described.

In the second embodiment, a solid-state imaging device is formed by using, for example, an SOI substrate.

FIG. 7 shows an SOI substrate 30. The SOI substrate 30 is composed of a semiconductor substrate 31, a BOX (Buried Oxide) layer 32, and an SOI (Silicon On Insulator) layer 33. The SOI layer 33 is P-type crystalline silicon, and the impurity concentration thereof is, e.g. about $1\times10^{18}$ to $1\times10^{20}$ cm$^{-3}$.

Subsequently, as shown in FIG. 8, an epitaxial layer 34 of, e.g. the N type is formed on the SOI layer 33. The impurity concentration of the epitaxial layer 34 is, e.g. about $1\times10^{15}$ to $1\times10^{17}$ cm$^{-3}$.

Then, as shown in FIG. 9, using the same CMOS image sensor manufacturing process as in the first embodiment, a solid-state imaging device is fabricated which includes a charge accumulation region 12, a P-type well region 13, a P-type diffusion layer 14 which isolates pixels, a trench 17, an N-type diffusion layer 18, a P-type shield layer 19, a gate insulation film 20, a transfer gate electrode 21 and a charge transfer destination diffusion layer 22. Then, peripheral circuits, such as MOSFETs (not shown), are formed on the substrate surface.

Next, as shown in FIG. 10, an interlayer insulation film including wiring 36 and a passivation film 35 are formed.

Then, as shown in FIG. 11, a support substrate 37 is bonded to the interlayer insulation film and passivation film 35 by using a bonding technique. The support substrate 37 may not be a semiconductor substrate, and it may be any substrate, such as a glass substrate, which can support the solid-state imaging device.

Thereafter, as shown in FIG. 12, the semiconductor substrate 31 and BOX layer 32, which constitute the SOI substrate, are removed by polishing or wet etching, and the SOI layer 33 is exposed.

Then, as shown in FIG. 13, an antireflection film 38 is formed on the SOI layer 33, to be more specific, at least over the entire surface of the imaging element. The antireflection film 38 may be a single-layer film or a multi-layer film, and the sensitivity of the imaging element can be increased by properly selecting the refractive index. Further, a color filter 39 and a micro-lens 40 are formed on the antireflection film 38.

In the above-described structure, the light, which has been made incident along the light incidence path indicated by an arrow in FIG. 13, is led to the charge accumulation region 12, which constitutes the photodiode, via the micro-lens 40, color filter 39 and antireflection film 38, and the light is converted to an electric signal. If the transfer gate electrode 21 is set at a high level, the charge that is accumulated in the charge accumulation region 12 is transferred to the charge transfer destination diffusion layer 22 via the transfer channel that is formed in the P-type well region 13.

According to the above-described second embodiment, in the solid-state imaging device having the transfer gate electrode 21, the light is made incident from the charge accumulation region 12 side. Accordingly, since the entire surface of the charge accumulation region 12 can be used as the light incident path, the photodiode, which is the light reception section, can be enlarged and the sensor performance can be enhanced.

Moreover, since the entire surface of the charge accumulation region 12 can be used as the light incident path, the degree of freedom of the position, where the transfer gate electrode 21 is formed relative to the charge accumulation region 12, can be increased. Specifically, in the first embodiment, the transfer gate electrode 21 is formed at a position with a bias from the central part of the charge accumulation region 12.

However, according to the second embodiment, as shown in FIG. 14, the transfer gate electrode 21 can be formed at a central part of the charge accumulation region 12. Therefore, the charge accumulation region 12 can be utilized more effectively, and further microfabrication of the pixel can be realized by making finer the charge accumulation region 12.

Modification

FIG. 15 shows a modification of the first and second embodiments. The parts common to those in the first and second embodiments are denoted by like reference numerals.

In the modification shown in FIG. 15, the impurity concentration of the P-type well region 13 is set to be adequately higher than in the first and second embodiments. In this case, the N-type diffusion layer 18 and P-type shield layer 19 can be dispensed with, and the trench 17 is formed in the P-type well region 13. In the case of this modification, since the N-type diffusion layer 18 and P-type shield layer 19 can be dispensed with, the photodiode that is the light reception section can made still larger, and the sensor performance can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a semiconductor substrate of a first conductivity type;
a charge accumulation region of the first conductivity type formed on the semiconductor substrate, configured to accumulate charges which are converted from light;
a first diffusion layer of the first conductivity type which is formed on a portion separate from a surface of the semiconductor substrate; and
a transfer gate electrode which is formed between the charge accumulation region and the first diffusion layer, wherein a charge transfer channel of the transfer gate electrode is formed between the charge accumulation region and the first diffusion layer, and formed vertical to the surface of the semiconductor substrate.

2. The device according to claim 1, further comprising a trench which is formed between the charge accumulation region and the first diffusion layer and has a bottom portion in the charge accumulation region, the transfer gate electrode being formed in the trench.

3. The device according to claim 2, further comprising a shield layer of a second conductivity type and a second diffusion layer which is formed in the charge accumulation region, and the shield layer being provided between the the second diffusion layer and the transfer gate electrode.

4. The device according to claim 2, wherein the trench is formed at a position with a bias from a central part of the charge accumulation region.

5. The device according to claim 2, wherein the trench is formed at a central part of the charge accumulation region.

6. The device according to claim 1, wherein the charge accumulation region of the first conductivity type has a higher concentration in a region thereof near the transfer gate electrode than in the other region thereof.

7. The device according to claim 1, wherein a front surface of the semiconductor substrate is a light reception surface.

8. The device according to claim 1, wherein a back surface of the semiconductor substrate is a light reception surface.

* * * * *